(12) United States Patent
Kuo et al.

(10) Patent No.: US 9,064,770 B2
(45) Date of Patent: Jun. 23, 2015

(54) METHODS FOR MINIMIZING EDGE PEELING IN THE MANUFACTURING OF BSI CHIPS

(75) Inventors: Chun-Ting Kuo, Tainan (TW); Kei-Wei Chen, Tainan (TW); Ying-Lang Wang, Tien-Chung Village (TW); Kuo-Hsiu Wei, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/551,457

(22) Filed: Jul. 17, 2012

(65) Prior Publication Data

US 2014/0024170 A1    Jan. 23, 2014

(51) Int. Cl.
*H01L 21/02* (2006.01)
*H01L 27/146* (2006.01)

(52) U.S. Cl.
CPC ...... *H01L 27/1464* (2013.01); *H01L 27/14687* (2013.01); *H01L 21/02087* (2013.01); *H01L 21/0209* (2013.01)

(58) Field of Classification Search
CPC ............. H01L 21/02087; H01L 21/0209; H01L 27/1464; H01L 27/14687
USPC .......... 438/459, 455, 748, 754, 460, 977; 257/E21.309, E21.228, E21.237, 257/E21.599; 216/92, 100
See application file for complete search history.

(56) References Cited

U.S. PATENT DOCUMENTS

| | | | |
|---|---|---|---|
| 6,586,342 B1 * | 7/2003 | Mayer et al. | 438/754 |
| 6,841,848 B2 * | 1/2005 | MacNamara et al. | 257/618 |
| 7,129,172 B2 * | 10/2006 | Morrow et al. | 438/690 |
| 7,883,991 B1 * | 2/2011 | Wu et al. | 438/459 |
| 8,158,487 B2 * | 4/2012 | Sousbie et al. | 438/431 |
| 8,172,646 B2 * | 5/2012 | Feng et al. | 451/41 |
| 8,268,726 B2 * | 9/2012 | Lee et al. | 438/689 |
| 8,298,916 B2 * | 10/2012 | Vaufredaz et al. | 438/459 |
| 8,314,007 B2 * | 11/2012 | Vaufredaz | 438/455 |
| 8,372,728 B2 * | 2/2013 | Vaufredaz et al. | 438/459 |
| 8,419,964 B2 * | 4/2013 | Ganesan et al. | 216/92 |
| 2002/0106905 A1 * | 8/2002 | Tran et al. | 438/754 |
| 2004/0035448 A1 * | 2/2004 | Aegerter et al. | 134/33 |
| 2005/0020001 A1 * | 1/2005 | Aegerter et al. | 438/199 |
| 2005/0085163 A1 * | 4/2005 | Hsu et al. | 451/11 |
| 2005/0217707 A1 * | 10/2005 | Aegerter et al. | 134/33 |
| 2006/0137714 A1 * | 6/2006 | Hong | 134/2 |
| 2006/0172526 A1 * | 8/2006 | Hsu et al. | 438/626 |
| 2007/0072393 A1 * | 3/2007 | Aspar et al. | 438/459 |
| 2008/0044984 A1 * | 2/2008 | Hsieh et al. | 438/459 |
| 2009/0004864 A1 * | 1/2009 | Kim et al. | 438/693 |
| 2009/0095399 A1 * | 4/2009 | Zussy et al. | 156/60 |
| 2010/0055924 A1 * | 3/2010 | Ganesan et al. | 438/748 |
| 2011/0097874 A1 * | 4/2011 | Broekaart et al. | 438/459 |
| 2011/0117691 A1 * | 5/2011 | Broekaart et al. | 438/73 |
| 2011/0151644 A1 * | 6/2011 | Vaufredaz | 438/459 |

(Continued)

*Primary Examiner* — Marvin Payen
*Assistant Examiner* — Victor Barzykin
(74) *Attorney, Agent, or Firm* — Slater & Matsil, L.L.P.

(57) ABSTRACT

A method includes forming top metal lines over a semiconductor substrate, wherein the semiconductor substrate is a portion of a wafer having a bevel. When the top metal lines are exposed, an etchant is supplied on the bevel, wherein regions of the wafer sprayed with the etchant has an inner defining line forming a first ring having a first diameter. A trimming step is performed to trim an edge portion of the wafer, wherein an edge of a remaining portion of the wafer has a second diameter substantially equal to or smaller than the first diameter.

22 Claims, 12 Drawing Sheets

(56) References Cited

U.S. PATENT DOCUMENTS

| | | | |
|---|---|---|---|
| 2011/0159687 A1* | 6/2011 | Lee et al. | 438/672 |
| 2012/0142165 A1* | 6/2012 | Huang et al. | 438/462 |
| 2012/0193741 A1* | 8/2012 | Borthakur et al. | 257/433 |
| 2012/0270394 A1* | 10/2012 | Shih et al. | 438/667 |
| 2012/0329369 A1* | 12/2012 | Shimizu et al. | 451/28 |

* cited by examiner

METHODS FOR MINIMIZING EDGE PEELING IN THE MANUFACTURING OF BSI CHIPS

BACKGROUND

Backside Illumination (BSI) image sensor chips are replacing front-side illumination sensor chips for their higher efficiency in capturing photons. In the formation of the BSI image sensor chips, image sensors and logic circuits are formed on a silicon substrate of a wafer, followed by the formation of an interconnect structure on a front side of the silicon substrate. The interconnect structure includes a plurality of metal layers. In the formation of the top metal layer in the plurality of metal layers, an Edge Bevel Removal (EBR) step may be performed to remove the metal that is deposited on the bevel of the BSI wafer. A passivation layer is then formed over the interconnect structure.

The formation of the image sensor chips involves one or more thin down processes to reduce the thickness of the semiconductor substrate on which the image sensors are formed. After thin down, the thickness of the semiconductor substrate is thin enough so that light can penetrate from the back surface of the semiconductor substrate. A trim process is also performed to trim some edge portions of the semiconductor substrate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Methods of forming backside structures of Backside Illumination (BSI) image sensor wafers/chips are provided in accordance with various embodiments. The intermediate stages in the formation of the BSI image sensor wafers/chips are illustrated. The variations of the embodiments are discussed. Throughout the various views and illustrative embodiments, like reference numbers are used to designate like elements.

Figure 1:
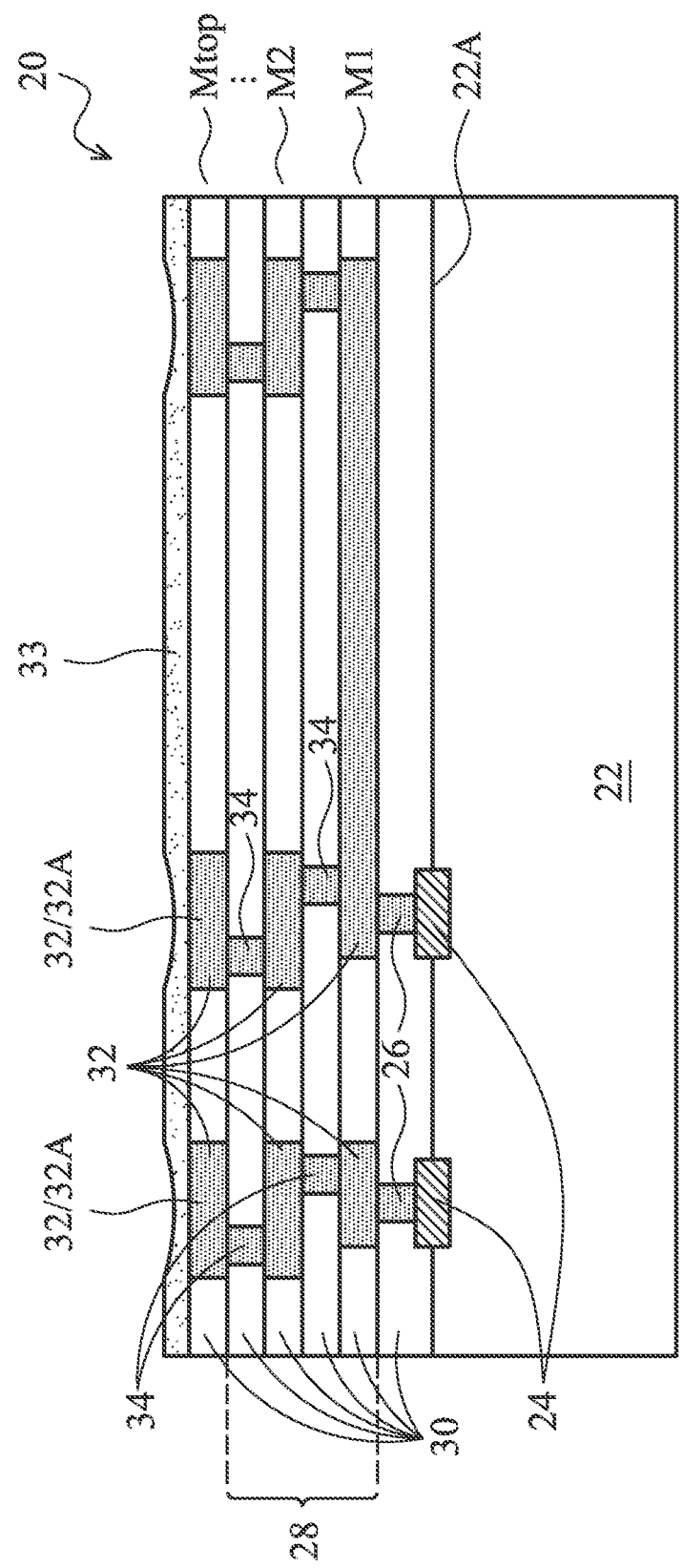
FIGS. 1 through 10 are cross-sectional views and top views of intermediate stages in the manufacturing of a backside illumination (BSI) image sensor wafer and a BSI chip in accordance with various embodiments.

FIG. 1 illustrates image sensor wafer 20, which includes semiconductor substrate 22. In some embodiments, semiconductor substrate 22 is a crystalline silicon substrate. Alternatively, semiconductor substrate 22 may be formed of other semiconductor materials such as silicon germanium, silicon carbon, III-V compound semiconductor materials, and the like. Image sensors 24 are formed at front surface 22A of semiconductor substrate 22, and may extend from front surface 22A into semiconductor substrate 22. Image sensors 24 may include photo-sensitive transistors and/or photo-sensitive diodes. In addition, core devices such as transistors, which are also illustrated as 24, are formed at the front surface of semiconductor substrate 22. Image sensors 24 are capable of converting light to electrical signals.

Interconnect structure 28 is formed over semiconductor substrate 22, and is used to electrically connect to the devices (such as image sensors 24) in image sensor wafer 20. Interconnect structure 28 includes Inter-Layer Dielectric (ILD) 30 formed over semiconductor substrate 22. Contact plugs 26 are formed in ILD 30, and are electrically coupled to image sensors and the core devices 24.

The metal layers are marked as M1, M2 . . . and Mtop, wherein metal layer M1 is the bottom metal layer of interconnect structure 28, and metal layer Mtop is the top metal layer of interconnect structure 28. The metal layers include metal lines/pads 32 and vias 34 in dielectric layers 30. Image sensors 24 may be electrically coupled to metal lines/pads 32 and vias 34 in metal layers M1 through Mtop. In some embodiments, dielectric layers 30, in which the metal lines 32 and vias 34 of metal layers M1 through Mtop are formed, are low-k dielectric layers having low k values. The k values of the low-k dielectric layers may be lower than about 3.0 or lower than 2.5. Dielectric layers 30 may also include non-low-k dielectric layers having k values greater than 3.9. In FIG. 1, the metal lines in metal layer Mtop are also referred to as 32A. The formation of metal layers M1 through Mtop may include damascene processes, wherein trenches and via openings are first formed in dielectric layers 30, followed by filling a metal(s) into the trenches and via openings. After the filling process, besides metal lines 32A that are filled in the trenches in the Mtop layer, the filling material also includes an excess portion over and outside of the trenches and via openings, which excess portion is referred to 33 hereinafter.

Figure 2:
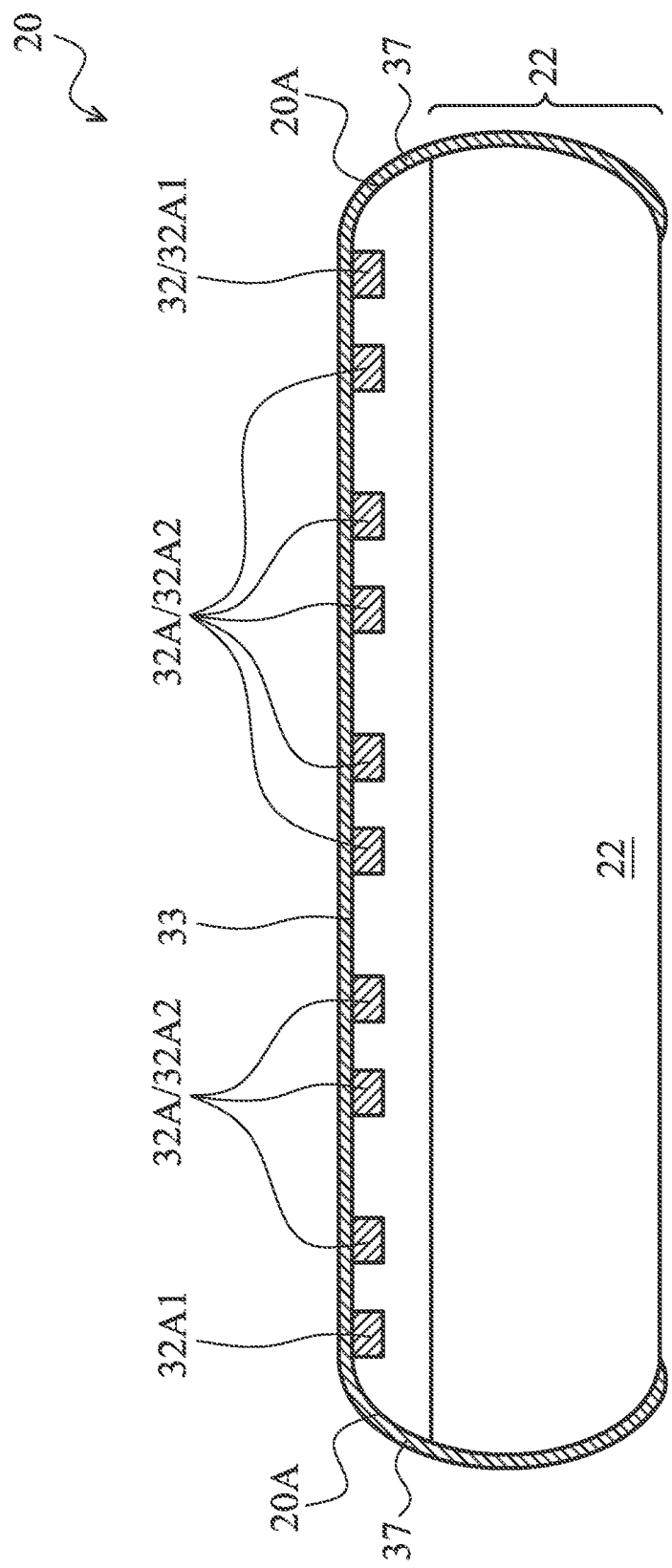

FIG. 2 illustrates a less-detailed cross-sectional view of wafer 20, wherein top metal lines 32A are illustrated, while other features such as the metal lines and vias under metal layer Mtop, devices 24, and the like, are not shown, although they still exist in wafer 20. Metal lines 32A include edge metal lines 32A1 that are disposed close to bevel 20A of wafer 20, and inner metal lines 32A2 farther away from bevel 20A of wafer 20 than edge metal lines 32A1. In the formation of top metal lines 32A, excess metal portions 37, such as copper, are also deposited on bevel 20A of wafer 20. Although a Chemical Mechanical Polish (CMP) will be performed later to remove excess portion 33 of the filling metal, excess metal portions 37 on bevel 20A will not be removed by the CMP. Excess metal portions 37 may also be deposited on the backside surface of wafer 20.

Figure 3A:
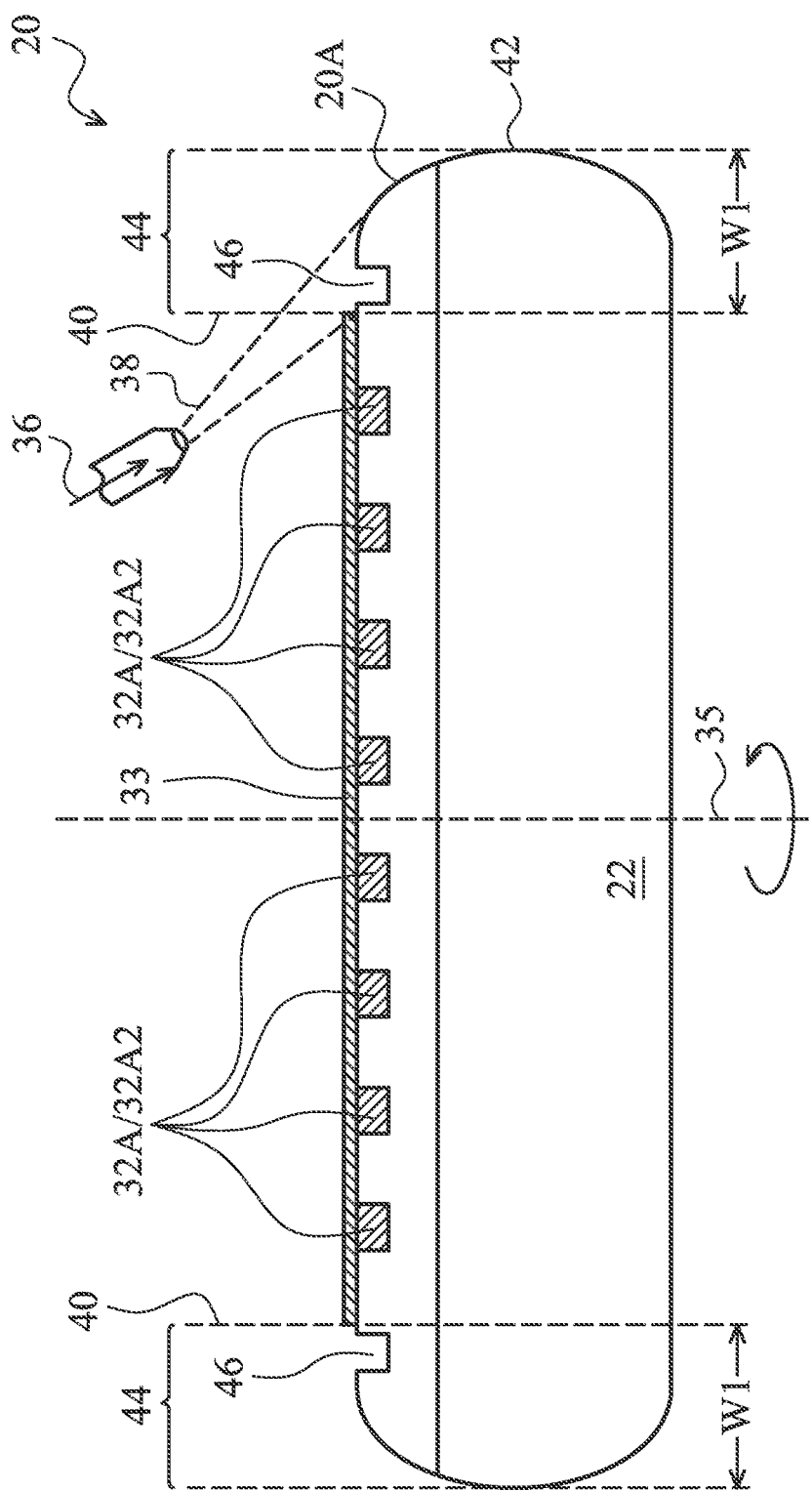
Figure 3B:
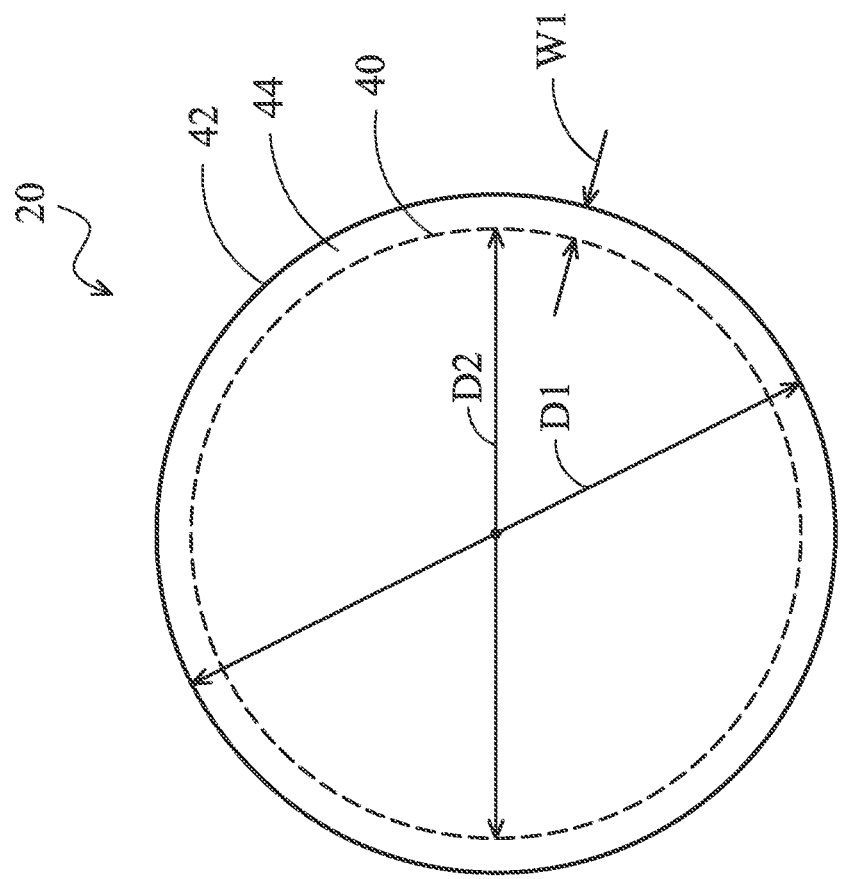

FIGS. 3A and 3B illustrate an Edge Bevel Removal (EBR) process for removing excess metal portions 37 from bevel 20A of wafer 20. The EBR process may also be used to remove the excess metal portion 37 from the back surface of wafer 20, if any. As illustrated in FIG. 3A, wafer 20 is rotated, for example, with respect to the axis of the rotation that is aligned to center line 35 of wafer 20. Nozzle 36 is used to spray etchant solution 38 onto bevel 20A of wafer 20. Nozzle 36 may be located at a fixed position, or may be moved in the regions adjacent to bevel 20A. With the rotation of wafer 20, etchant solution 38 may be sprayed to all bevels of wafer 20. In some embodiments, there may be more than one nozzle 36, for example, with one spraying to bevel 20A, and the other (not shown, similar to nozzle 36) spraying to the back surface of wafer 20. The portion of wafer 20 whose top surface receives etchant solution 38 is referred to EBR region 44 hereinafter. EBR region 44 has inner defining line 40, which is also the interface between EBR region 44 and the inner region of wafer 20 that does not receive etchant solution 38. Width W1, which is measured from inner defining line 40 to the outermost edge 42 of wafer 20, is referred to EBR width W1 hereinafter. In some exemplary embodiments, EBR width W1 may be between about 1 mm and about 3 mm. It is appreciated that the dimensions recited throughout the description are merely examples, and may be changed to different values.

FIG. 3B illustrates a top view of wafer 20, wherein EBR region 44 and its inner defining line 40 are illustrated. It is appreciated that EBR region 44 and the respective inner defining line 40 form closed-loop rings. From the top view, it is observed that wafer 20 has diameter D1, and the ring of the defining line 40 has diameter D2, which is smaller than diameter D1.

Referring back to FIG. 3A, etchant solution 38 may comprise sulfuric acid in some exemplary embodiments, which is capable of etching metal portions 37. It is appreciated that although in the illustrated embodiments, the spray of etchant solution 38 is used as an example for the removal of excess metal portions 37, any other suitable methods and materials may also be used. Due to the spray, edge metal lines 32A1 (FIG. 2), which are within EBR region 44, are also etched, and hence trenches 46 are left. Inner metal lines 32A2 do not receive the etchant solution 38, and hence are not etched.

Figure 4:
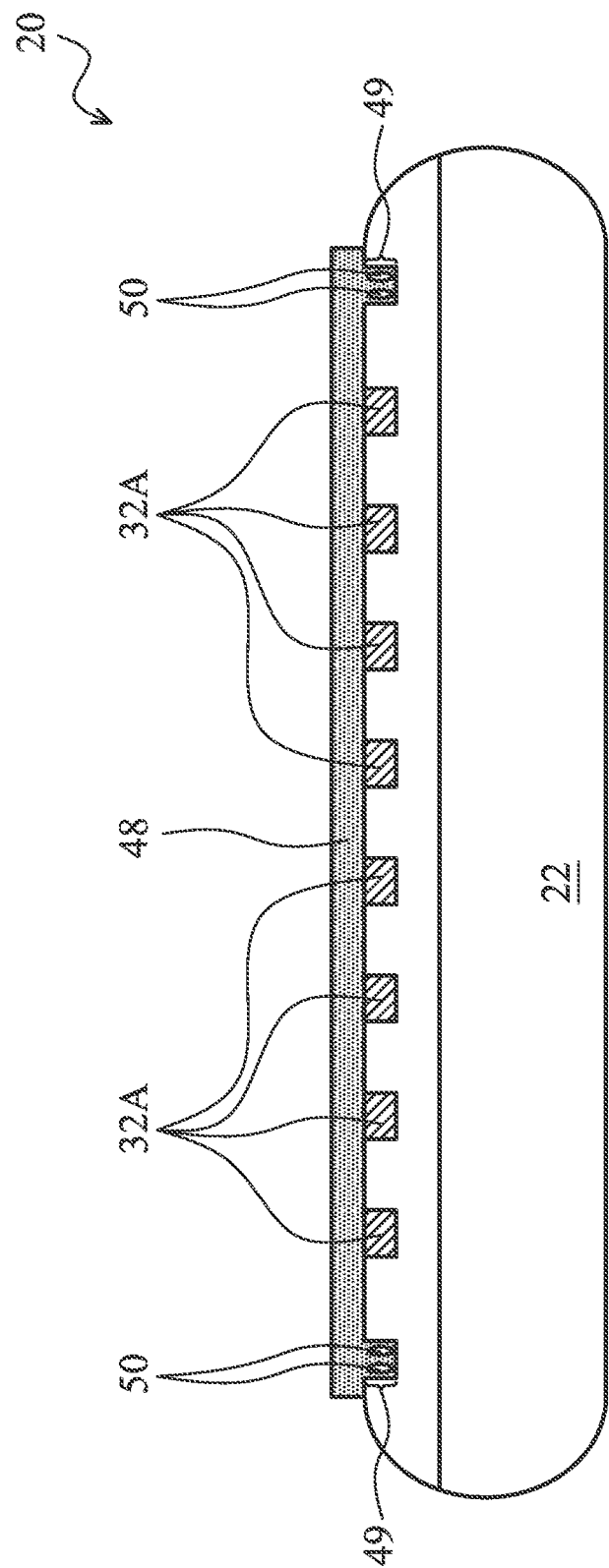

After the EBR process, a Chemical Mechanical Polish (CMP) is performed to remove the excess portion 33 outside the trenches and via openings. The resulting structure is shown in FIG. 4. The remaining portions of the metal in the trenches and via openings are the metal lines 32A and vias 34.

Referring again to FIG. 4, passivation layer 48 is formed over top metal layer Mtop. In some embodiments, passivation layer 48 is formed of an oxide such as silicon oxide, un-doped silicate glass (USG), or the like. Alternatively, passivation layer 48 may be a composite layer including a silicon oxide layer and a silicon nitride layer on the silicon oxide layer. Passivation layer 48 is also filled into trenches 46, wherein the portions of passivation layer 48 in trenches 46 are referred to as trench passivation regions 49 hereinafter. In some embodiments, voids 50 are formed in trench passivation regions 49. As a result, trench passivation regions 49 are the weak portions of passivation layer 48, and may peel or crack in subsequent process steps.

Figure 5:
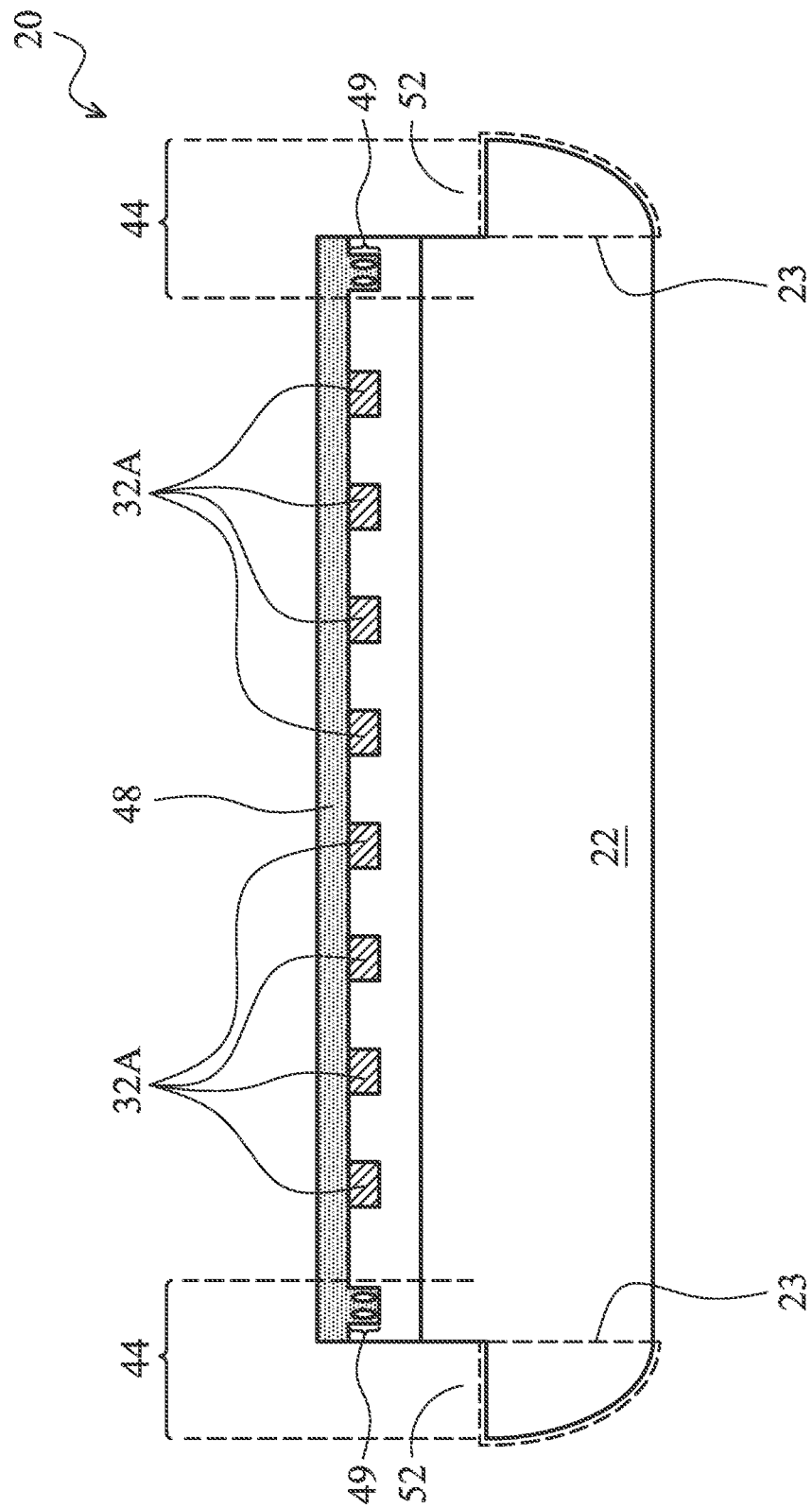

FIG. 5 illustrates the first trim process for trimming edge portions of wafer 20. After the first trim process, some portions of EBR region 44 remain, although some edge portions of EBR region 44 are trimmed. Trench passivation regions 49 may have portions remaining after the first trim process in some embodiments. The recess 52 formed by the first trim process may extend into semiconductor substrate 22. As shown in FIG. 5, semiconductor substrate 22 may include portions 23 that are underlying recess 52.

Figure 6:
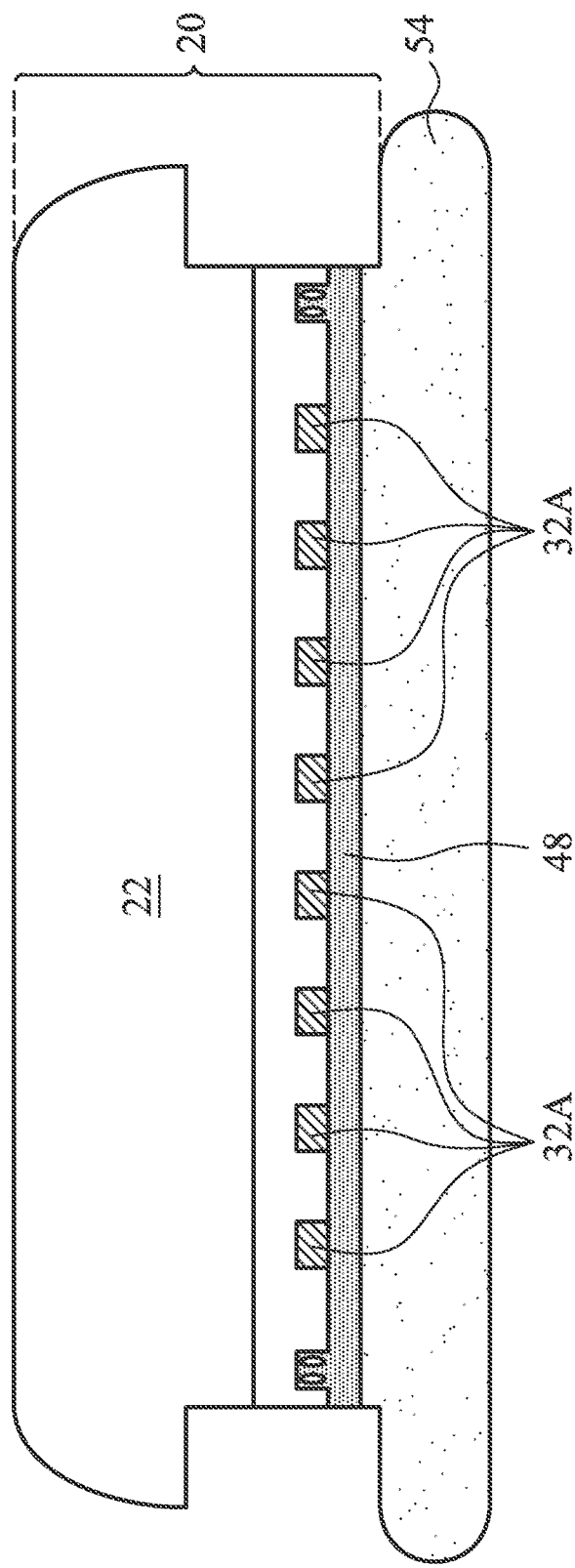

Referring to FIG. 6, wafer 20 is bonded to carrier 54. In some embodiments, carrier 54 is a silicon wafer formed of, for example, crystalline bulk silicon, although it may also be formed of other materials. The top-view shape of carrier 54 may be substantially the same as the top-view shape of wafer 20, which may have a circular top view shape. The top-view size of carrier 54 may also be substantially equal to the top-view size of wafer 20. In some exemplary embodiments, the bonding process include forming an oxide layer (not shown) on carrier 54, performing plasma activation steps on the oxide layer on carrier 54 and passivation layer 48, and then bonding carrier 54 and wafer 20 together through an oxide-to-oxide bonding. During the bonding process, a pressure may be applied to force wafer 20 and carrier 54 against each other. The temperature of carrier 54 and/or wafer 20 may also be increased in the bonding process.

Figure 7:
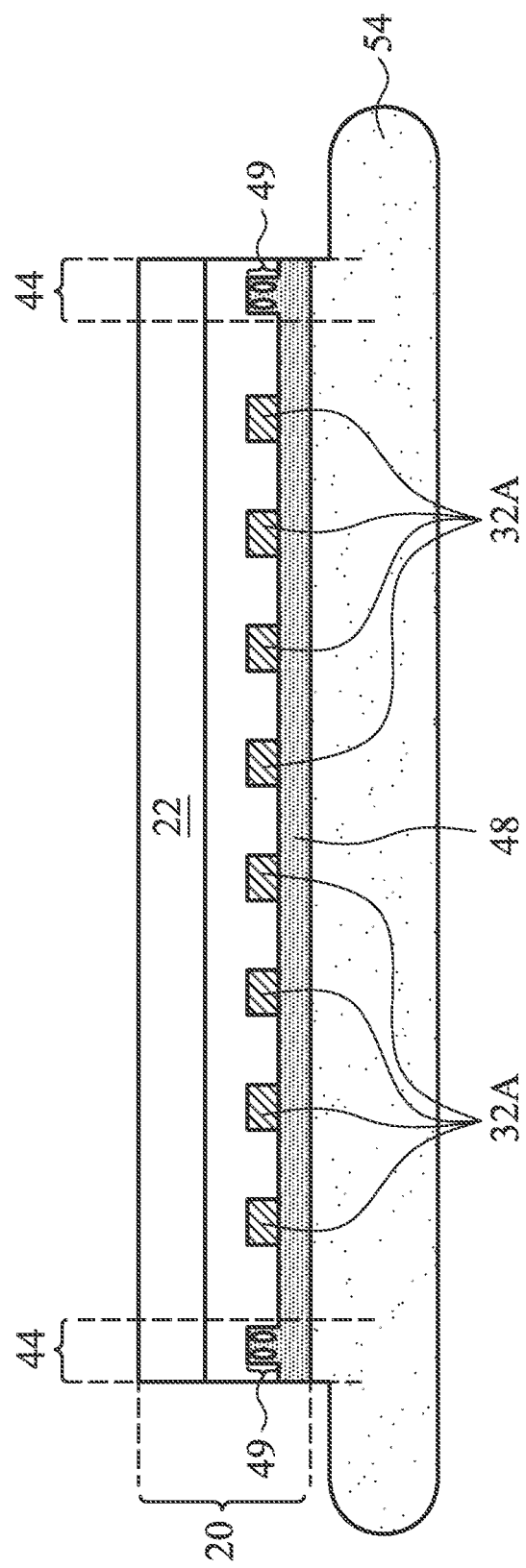

FIG. 7 illustrates first backside processes, such as grinding, Chemical Mechanical Polish (CMP), or wet etch processes, which is performed on the backside of substrate 22. After the first thin down process, the thickness of substrate 22 may be reduced from, for example, several hundred microns to tens of microns or several microns. After the first thin down process, portions 23 (FIG. 5) of semiconductor substrate 22 are removed.

Figure 8A:
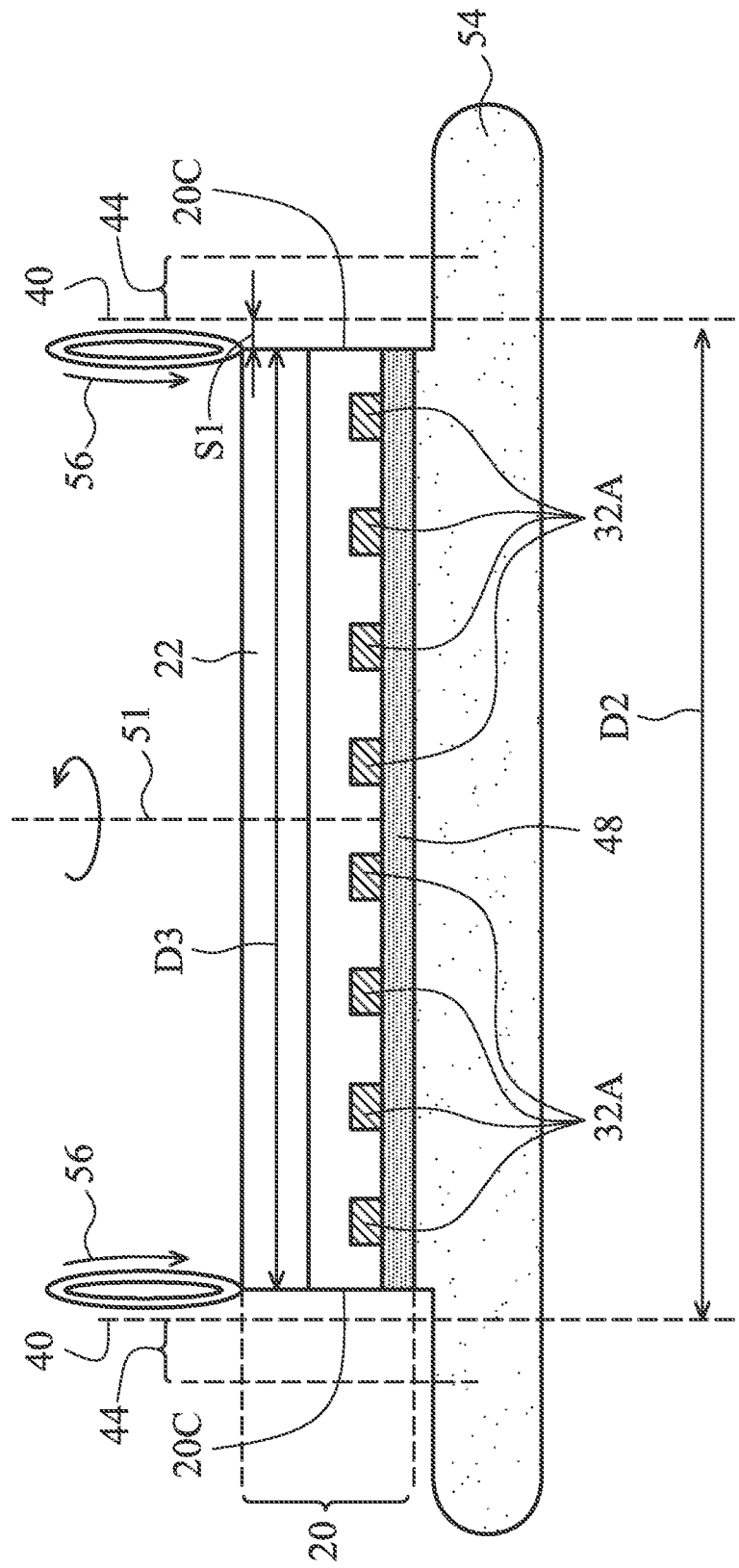
Figure 8B:
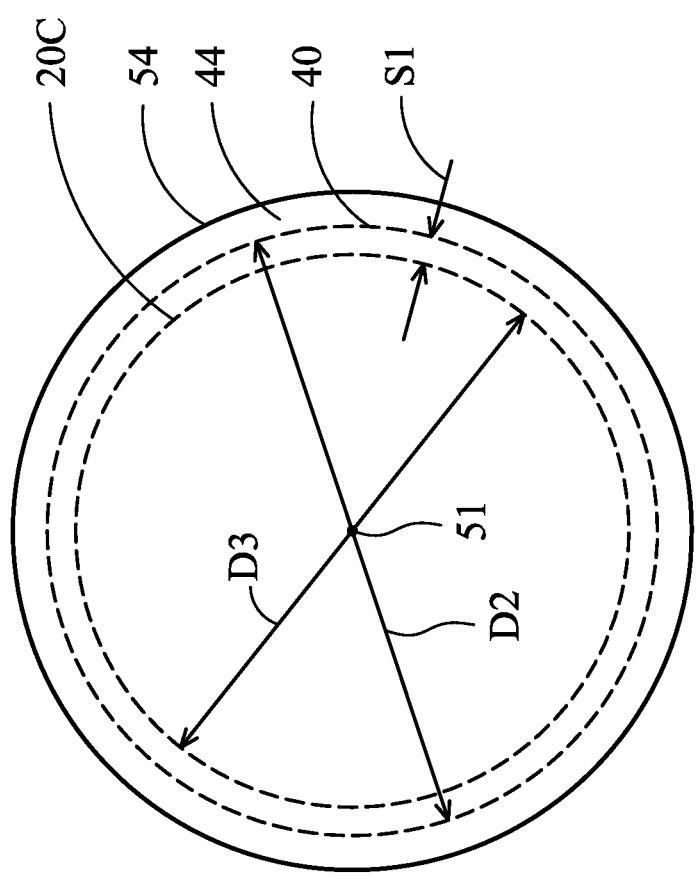

Next, as shown in FIGS. 8A and 8B, a second trim process is performed, for example, using blade 56, so that EBR region 44 as shown in FIG. 7 is trimmed. After the trimming, the edge of the remaining wafer 20 is referred to as edge 20C. Edge 20C is alternatively referred to as a trim line since it is where wafer 20 is trimmed. FIG. 8B illustrates a top view of the structure shown in FIG. 8A. As shown in FIG. 8B, in the second trim process, EBR region 44 is trimmed. The trimmed portion of wafer 20 forms a full circle. In some embodiments, edge 20C of the remaining wafer 20 is aligned to the inner defining line 40 of EBR region 44. In alternative embodiments, as illustrated in FIGS. 8A and 8B, edge 20C of the remaining wafer 20 is closer to center line 51 of wafer 20. Alternatively stated, some of the inner portions of wafer 20 that was not sprayed in the EBR step (shown in FIGS. 3A and 3B) may also be trimmed. As shown in FIGS. 8A and 8B, the spacing S1 between inner defining line 40 of EBR region 44 and the edge 20C may be equal to or greater than 0 mm, or greater than about 1 mm. Spacing S1 may also be between about 1 mm and about 3 mm in some exemplary embodiments. Accordingly, edge 20C of wafer 20 has diameter D3, which may be equal to or smaller than diameter D2 of inner edge ring 40, and may be smaller than diameter D2 by greater than about 2 mm. This ensures that trench passivation regions 49 (FIG. 7) and the adjacent weak portions of wafer 20 are trimmed. Since trench passivation regions 49 are mechanically weak, the fragments of trench passivation regions 49 may peel off during the subsequent process steps if they are not trimmed off. The manufacturing yield hence may be adversely affected. By trimming off trench passivation regions 49, the loss in the manufacturing yield is prevented.

Figure 9:
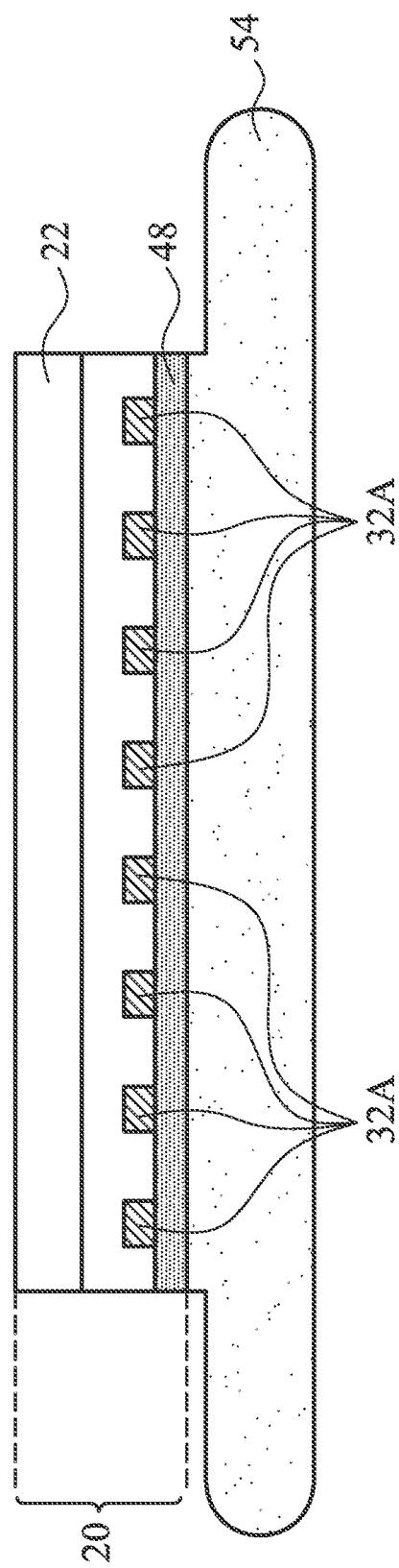

Referring to FIG. 9, after the trimming process, a further thin down-process, such as grinding, CMP, or wet etch process, is performed to further thin down semiconductor substrate 22. In some exemplary embodiments, the thickness of substrate 22 may be reduced to 1 μm to about 3 μm.

Figure 10:
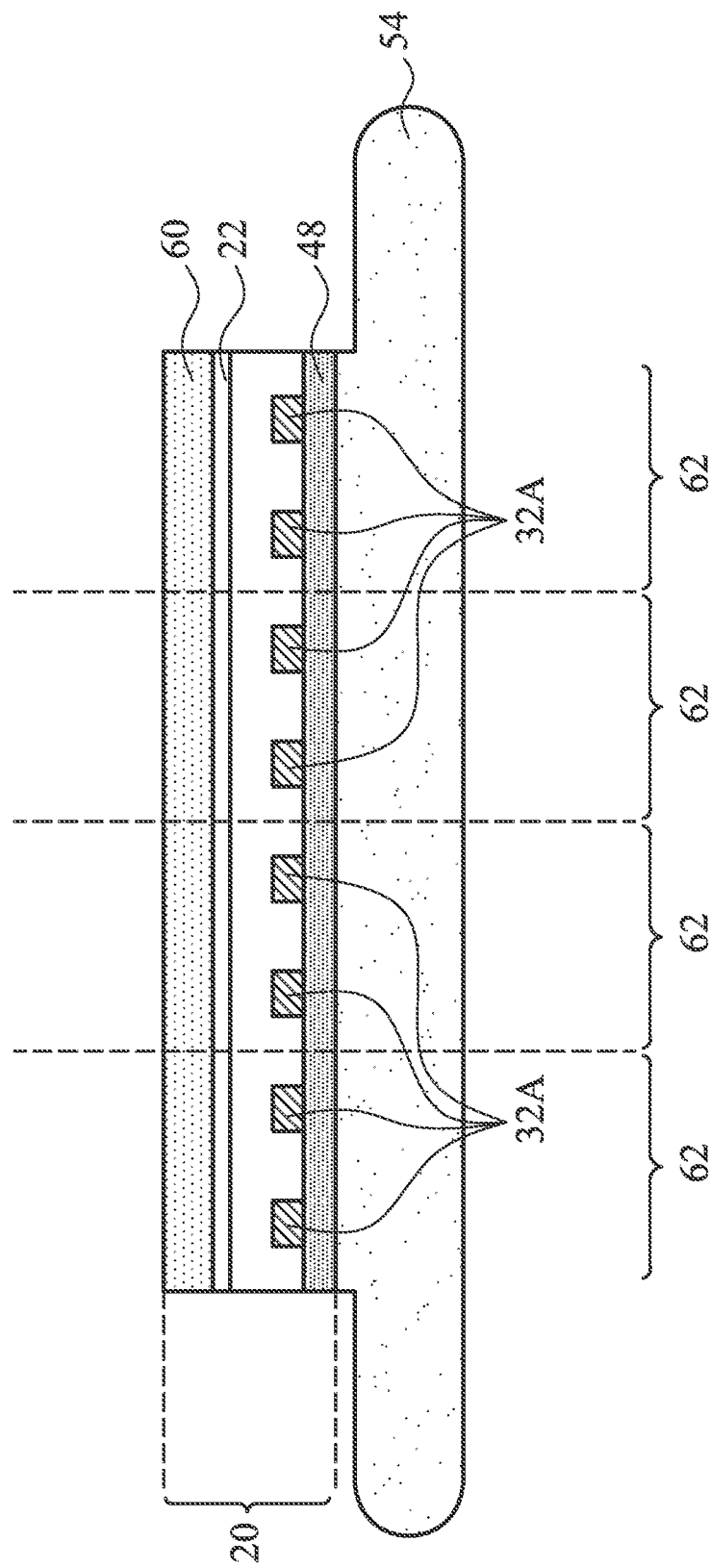

In subsequent process steps, as shown in FIG. 10, further process steps are performed to form the remaining portions (symbolized as 60) of the BSI chips. The remaining portions may include electrical pads (for wire bonding, for example), a metal grid, a metal shield, micro-lenses, color filters, and the like. Wafer 20 and the underlying carrier 54 are then sawed into a plurality of dies 62, wherein each of the dies 62 includes a piece of wafer 20 and a piece of carrier 54.

In the embodiments, by trimming off EBR region 44 (referring to FIGS. 7, 8A, and 8B), the mechanical weak portions that are formed as the result of the EBR process are removed. The peeling of the weak portions of the mechanical weak portions is accordingly prevented.

In accordance with embodiments, a method includes forming top metal lines over a semiconductor substrate, wherein the semiconductor substrate is a portion of a wafer having a bevel. When the top metal lines are exposed, an etchant is supplied on the bevel, wherein regions of the wafer sprayed with the etchant has an inner defining line forming a first ring having a first diameter. A trimming step is performed to trim an edge portion of the wafer, wherein an edge of a remaining portion of the wafer has a second diameter substantially equal to or smaller than the first diameter.

In accordance with other embodiments, a method includes forming an image sensor at a front side of a semiconductor substrate, wherein the semiconductor substrate is in a semiconductor wafer having a bevel. Top metal lines are formed over the semiconductor substrate, wherein the top metal lines include edge portions adjacent to the bevel, and inner portions closer to a center of the semiconductor wafer than the edge portions. An edge bevel removal step is performed using an etchant to remove a metallic material from the bevel of the wafer. The edge portions of the top metal lines are removed during the edge bevel removal. Portions of the wafer receiving the etchant form a first ring having an inner defining line, with portions of a top surface of the wafer inside the inner ring not receiving the etchant. From a backside of the semiconductor wafer, a trimming step is performed, with a trim line forming a second ring. The second ring is located inside the first ring. The first ring and the second ring have a spacing greater than about 1 millimeter.

In accordance with yet other embodiments, a method includes forming a front-side structure of a wafer. When top metal lines of the front-side structure are exposed, an edge bevel removal step on an edge portion of the wafer to remove a metallic material from a bevel of the wafer. The outer portions of the top metal lines in an EBR region of the wafer are etched during the edge bevel removal, and wherein inner portions of the top metal lines closer to a center of the wafer than an inner defining line of the EBR region are not etched. A trimming step is performed to trim off all portions of the wafer that are farther away from the center of the wafer than the inner defining line of the EBR region. A spacing between the trim line and the inner defining line of the EBR region is greater than about 1 millimeter.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming top metal lines over a semiconductor substrate, wherein the semiconductor substrate is a portion of a wafer comprising a bevel;
   wherein the top metal lines are exposed, supplying an etchant to the bevel, wherein a region of the wafer supplied with the etchant has an inner defining line forming a first ring having a first diameter; and
   performing a trimming step to trim an edge portion of the wafer, wherein an edge of a remaining portion of the wafer has a second diameter substantially equal to or smaller than the first diameter.

2. The method of claim 1, wherein the second diameter is smaller than the first diameter.

3. The method of claim 2, wherein the second diameter is smaller than the first diameter by greater than about 2 mm.

4. The method of claim 1, wherein the trimming is performed after the supplying the etchant to the bevel.

5. The method of claim 1 further comprising:
   after the step of supplying the etchant, forming a passivation layer over the top metal lines;
   bonding a carrier on the passivation layer; and
   performing a thin down process from a backside of the semiconductor substrate to thin down the semiconductor substrate.

6. The method of claim 5, wherein the trimming step is performed after the step of performing the thin down process, and wherein the method further comprises, after the trimming step, performing an additional thin down process from the backside of the semiconductor substrate to further thin down the semiconductor substrate.

7. The method of claim 5, wherein during the step of supplying the etchant, edge portions of the top metal lines are etched by the etchant, and inner portions of the top metal lines closer to a center of the wafer than the edge portions are not etched, and wherein in the step of forming the passivation layer, trenches left by the etched edge portions of the top metal lines are filled with the passivation layer.

8. The method of claim 5 further comprising:
   performing an additional trimming step to form a recess extending from a front surface of the wafer to an intermediate level of the wafer, with an edge portion of the wafer aligned to the recess, and wherein in the thin down process, the edge portion of the wafer is removed.

9. The method of claim 1, wherein in the step of supplying the etchant, a metallic material on the bevel is removed, wherein the metallic material comprises a same metal as the top metal lines.

10. A method comprising:
    forming an image sensor at a front side of a semiconductor substrate, wherein the semiconductor substrate is comprised in a semiconductor wafer comprising a bevel;
    forming top metal lines over the semiconductor substrate, wherein the top metal lines comprise edge portions adjacent to the bevel, and inner portions closer to a center of the semiconductor wafer than the edge portions;
    performing an edge bevel removal using an etchant to remove a metallic material from the bevel of the wafer, wherein the edge portions of the top metal lines are removed during the edge bevel removal, and wherein portions of the wafer receiving the etchant form a first ring having an inner defining line, with portions of a top surface of the wafer inside the inner ring not receiving the etchant;
    performing a first thin down process for thinning down a semiconductor substrate of the wafer; and
    from a backside of the semiconductor wafer, performing a trimming step after the first thin down process, with a trim line forming a second ring, wherein the second ring is located inside the first ring.

11. The method of claim 10, wherein the first ring and the second ring has a spacing greater than about 1 mm.

12. The method of claim 10, further comprising, after the step of performing the edge bevel removal, forming a dielectric layer over the top metal lines, wherein the trimming step is performed after the edge bevel removal and the forming the dielectric layer.

13. The method of claim 10 further comprising a second thin down process after the step of trimming to further thin down the semiconductor substrate.

14. The method of claim 10, wherein the edge bevel removal is performed by spraying an acid to the bevel of the wafer.

15. The method of claim 10 further comprising:
performing an additional trimming step to form a recess extending from a front surface of the wafer to an intermediate level of the wafer, with an edge portion of the wafer aligned to the recess, and wherein in the first thin down process, the edge portion of the wafer is removed.

16. A method comprising:
forming a front-side structure of a wafer;
wherein top metal lines of the front-side structure are exposed, performing an Edge Bevel Removal (EBR) on an edge portion of the wafer to remove a metallic material from a bevel of the wafer, wherein outer portions of the top metal lines in an EBR region of the wafer are etched during the EBR, and wherein inner portions of the top metal lines closer to a center of the wafer than an inner defining line of the EBR region are not etched; and
performing a trimming step to trim off all portions of the wafer that are farther away from the center of the wafer than the inner defining line of the EBR region.

17. The method of claim 16, wherein a trim line of trimming step is on an inner side of the inner defining line of the EBR region, and the trimming step is performed after the performing the EBR.

18. The method of claim 17, wherein a spacing between the trim line and the inner defining line of the EBR region is greater than about 1 millimeter.

19. The method of claim 16 further comprising, after the step of performing the EBR, forming a dielectric layer on the front side of the wafer and over the top metal lines, wherein the dielectric layer is filled into trenches left by etched outer portions of the top metal lines in the EBR region.

20. The method of claim 16 further comprising:
performing a first thin down process for thinning down a semiconductor substrate of the wafer, wherein the trimming step is performed after the first thin down process; and
performing a second thin down process to further thin down the semiconductor substrate, wherein the second thin down process is performed after the trimming step.

21. The method of claim 16 further comprising forming an image sensor in the wafer.

22. The method of claim 20 further comprising:
performing an additional trimming step to form a recess extending from a front surface of the wafer to an intermediate level of the wafer, with an edge portion of the wafer aligned to the recess, and wherein in the first thin down process, the edge portion of the wafer is removed.

* * * * *